United States Patent
Kobayashi et al.

(10) Patent No.: US 10,490,440 B2
(45) Date of Patent: Nov. 26, 2019

(54) METHOD FOR MANUFACTURING BONDED SOI WAFER

(71) Applicant: SHIN-ETSU HANDOTAI CO., LTD., Tokyo (JP)

(72) Inventors: Norihiro Kobayashi, Takasaki (JP); Hiroji Aga, Takasaki (JP)

(73) Assignee: SHIN-ETSU HANDOTAI CO., LTD., Tokyo (JP)

(\*) Notice: Subject to any disclaimer, the term of this patent is extended or adjusted under 35 U.S.C. 154(b) by 0 days.

(21) Appl. No.: 16/303,701

(22) PCT Filed: Apr. 25, 2017

(86) PCT No.: PCT/JP2017/016431
§ 371 (c)(1),
(2) Date: Nov. 21, 2018

(87) PCT Pub. No.: WO2017/212812
PCT Pub. Date: Dec. 14, 2017

(65) Prior Publication Data
US 2019/0221470 A1    Jul. 18, 2019

(30) Foreign Application Priority Data
Jun. 6, 2016 (JP) .................... 2016-112475

(51) Int. Cl.
*H01L 21/762* (2006.01)
*H01L 21/02* (2006.01)
(Continued)

(52) U.S. Cl.
CPC ........ *H01L 21/76254* (2013.01); *H01L 21/02* (2013.01); *H01L 21/02381* (2013.01);
(Continued)

(58) Field of Classification Search
CPC ............... H01L 21/76254; H01L 21/02; H01L 21/02381; H01L 21/2007; H01L 27/12; H01L 27/1203
(Continued)

(56) References Cited

U.S. PATENT DOCUMENTS

| 2007/0032040 A1 | 2/2007 | Lederer |
| 2012/0319121 A1 | 12/2012 | Reynaud et al. |
| 2014/0084290 A1 | 3/2014 | Allibert et al. |

FOREIGN PATENT DOCUMENTS

| JP | H10-107237 A | 4/1998 |
| JP | 2007-507093 A | 3/2007 |

(Continued)

OTHER PUBLICATIONS

Aug. 1, 2017 International Search Report issued in International Patent Application No. PCT/JP2017/016431.

*Primary Examiner* — Elias Ullah
(74) *Attorney, Agent, or Firm* — Oliff PLC

(57) ABSTRACT

Method for manufacturing bonded SOI wafer by bonding bond wafer and base wafer each composed of silicon single crystal with insulator film being interposed therebetween, including steps of: depositing polycrystalline silicon layer on bonding surface side of base wafer; polishing surface of polycrystalline silicon layer to obtain polished surface; forming thermal oxide film on polished surface; forming insulator film on bonding surface of bond wafer; bonding step of bonding bond and base wafers by bringing insulator and oxide films into close contact with each other; and thinning bonded bond wafer to form SOI layer, wherein silicon single crystal wafer having resistivity of 100 Ω·cm or more is used as base wafer, thermal oxide film formed on polished surface has thickness of 15 nm or more with RMS of 0.6 nm or less, and any heat treatment after bonding step (Continued)

is performed with maximum treatment temperature of 1150° C. or less.

2 Claims, 3 Drawing Sheets

(51) Int. Cl.
    *H01L 27/12*          (2006.01)
    *H01L 21/20*          (2006.01)

(52) U.S. Cl.
    CPC .......... *H01L 21/2007* (2013.01); *H01L 27/12* (2013.01); *H01L 27/1203* (2013.01)

(58) Field of Classification Search
    USPC ........................................................ 438/458
    See application file for complete search history.

(56) References Cited

FOREIGN PATENT DOCUMENTS

| | | |
|---|---|---|
| JP | 2013-513234 A | 4/2013 |
| JP | 2014-509087 A | 4/2014 |
| JP | 2014-127590 A | 7/2014 |
| JP | 2015-060887 A | 3/2015 |
| JP | 2015-228432 A | 12/2015 |

METHOD FOR MANUFACTURING BONDED SOI WAFER

TECHNICAL FIELD

The present invention relates to a method for manufacturing a bonded SOI wafer.

BACKGROUND ART

As an SOI wafer for a RF (Radio Frequency) device, the SOI wafer has been treated by increasing the resistivity of the base wafer. However, it has been required to cope with higher frequency in order to handle further speedup, and accordingly it comes to be difficult to handle only by using conventional high-resistance wafers.

Hence, it is suggested as measures that a layer, which is effective in annihilating generated carriers (a carrier trap layer), should be added immediately under a buried oxide film layer (a BOX layer) of an SOI wafer. It is becoming necessary to form a polycrystalline silicon layer having high resistivity on a base wafer to recombine carriers generated in the high-resistivity wafer.

Patent Document 1 describes forming a polycrystalline silicon layer or an amorphous silicon layer as the carrier trap layer at an interface between a BOX layer and a base wafer. On the other hand, Patent Document 2 also describes forming a polycrystalline layer as the carrier trap layer at an interface between a BOX layer and a base wafer; furthermore, heat treatment temperature after forming the polycrystalline silicon layer is restricted to prevent recrystallization of the polycrystalline silicon layer.

Moreover, Patent Document 3 describes forming a dielectric material layer of thickness of 0.5 to 10 nm, which is different from a native oxide film, on a silicon substrate having a high resistivity more than 500 $\Omega \cdot cm$, and then forming a polycrystalline silicon layer to manufacture an SOI wafer usable for RF devices.

Meanwhile, Patent Document 4 describes forming a polycrystalline silicon layer or an amorphous silicon layer on a bonding surface side of a base wafer; further, the base wafer used has a resistivity of 100 $\Omega \cdot cm$ or more and the surface, on which the polycrystalline silicon layer is formed, has a surface roughness of 2 nm or more.

In addition, Patent Document 5 describes forming a thermal nitride film on a bonding surface side of a base wafer having a resistivity of 100 $\Omega \cdot cm$ or more before a step of forming a polycrystalline silicon layer or an amorphous silicon layer on the bonding surface side of the base wafer.

CITATION LIST

Patent Literature

Patent Document 1: Japanese Unexamined Patent Publication (Kohyou) No. 2007-507093
Patent Document 2: Japanese Unexamined Patent Publication (Kohyou) No. 2013-513234
Patent Document 3: Japanese Unexamined Patent Publication (Kohyou) No. 2014-509087
Patent Document 4: Japanese Unexamined Patent Publication (Kokai) No. 2015-60887
Patent Document 5: Japanese Unexamined Patent Publication (Kokai) No. 2015-228432

SUMMARY OF INVENTION

Technical Problem

As mentioned above, a carrier trap layer for recombining generated carriers is becoming necessary immediately under a BOX layer of an SOI wafer, that is, on a base wafer.

When a polycrystalline silicon layer is used as the carrier trap layer, the polycrystalline silicon layer is grown on the base wafer and polished. Then, at room temperature, the polycrystalline silicon layer is bonded to a bond wafer having an insulator film formed on the surface. Subsequently, the bond wafer is thinned to manufacture an SOI wafer. In the steps for manufacturing an SOI wafer after the bonding at room temperature, heat treatments are performed such as, for example, a bonding heat treatment for increasing the bonding strength at the bonding interface, a flattening heat treatment for flattening the surface of an SOI layer after thinning, and a sacrificial oxidation heat treatment for adjusting the thickness of the SOI layer.

In such events, before the bonding step at room temperature, environment-derived boron present in a clean room is attached to the wafer(s). In the bonding step, the boron is enclosed in the bonding surface of the wafers. The boron diffuses into the carrier trap layer during the heat treatments in the subsequent steps for manufacturing an SOI wafer, thereby decreasing the resistivity of the high-resistivity substrate serving as the base wafer.

If the resistivity of the high-resistivity substrate is decreased to 1000 $\Omega \cdot cm$ or less, the secondary higher harmonic distortion characteristic is greatly decreased. Thus, it is important to eliminate the influence of this environmental boron contamination. Irrespective of the influence from the environmental boron contamination, the secondary higher harmonic distortion characteristic of an SOI wafer having a carrier trap layer needs to be enhanced.

Patent Documents 3 to 5 mentioned above also state that, in a bonded SOI wafer using a polycrystalline silicon layer as a carrier trap layer, an oxide film can be formed on the surface of the polycrystalline silicon layer, and used for the bonding. However, none of the patent documents discloses an example demonstrating that an oxide film is actually formed on the surface of the polycrystalline silicon layer. Moreover, when the structure having a polycrystalline silicon layer on a base wafer is subjected to base oxidation (which means forming an oxide film on a base wafer side), the surface roughness is increased, a problem that the bonding is hindered is brought about in some cases.

The present invention has been made to solve the above problems. An object of the present invention is to provide a method for manufacturing a bonded SOI wafer, which suppresses the influence of boron contamination from a bonding interface, so that a decrease in the resistivity of a high-resistivity substrate can be suppressed.

Solution to Problem

To achieve the above object, the present invention provides a method for manufacturing a bonded SOI wafer by bonding a bond wafer and a base wafer each composed of a silicon single crystal with an insulator film being interposed therebetween, the method comprising the steps of:
depositing a polycrystalline silicon layer on a bonding surface side of the base wafer;

polishing a surface of the polycrystalline silicon layer to obtain a polished surface;

forming a thermal oxide film on the polished surface;

forming the insulator film on a bonding surface of the bond wafer;

a bonding step of bonding the bond wafer and the base wafer by bringing the insulator film and the thermal oxide film into close contact with each other; and thinning the bonded bond wafer to form an SOI layer, wherein a silicon single crystal wafer having a resistivity of 100 Ω·cm or more is used as the base wafer, the thermal oxide film formed on the polished surface has a thickness of 15 nm or more, the thermal oxide film formed on the polished surface has a surface with an RMS of 0.6 nm or less, and any heat treatment after the bonding step is performed with a maximum treatment temperature of 1150° C. or less.

Such a method for manufacturing a bonded SOI wafer makes it possible to suppress an influence of boron contamination from the bonding interface, thus suppressing a decrease in the resistivity of the high-resistivity substrate. In addition, since the thermal oxide film has the surface with an RMS of 0.6 nm or less, generation of voids and blisters can be suppressed at the time of bonding.

Here, preferably, the polished surface has an RMS of 0.3 nm or less, and the thermal oxide film formed on the polished surface has a thickness of 25 nm or less.

In this manner, when the polished surface has an RMS of 0.3 nm or less and the thermal oxide film formed on the polished surface has a thickness of 25 nm or less, it is possible to surely suppress the RMS on the surface of the thermal oxide film to 0.6 nm or less.

Advantageous Effects of Invention

The method for manufacturing a bonded SOI wafer according to the present invention makes it possible to suppress an influence of boron contamination from the bonding interface, and thus suppress a decrease in the resistivity of the high-resistivity substrate. Moreover, the thermal oxide film having the surface with an RMS of 0.6 nm or less can suppress generations of voids and blisters at the time of bonding.

DESCRIPTION OF EMBODIMENTS

Hereinafter, the present invention will be described in detail with reference to the drawings, but the present invention is not limited thereto.

Figure 1:
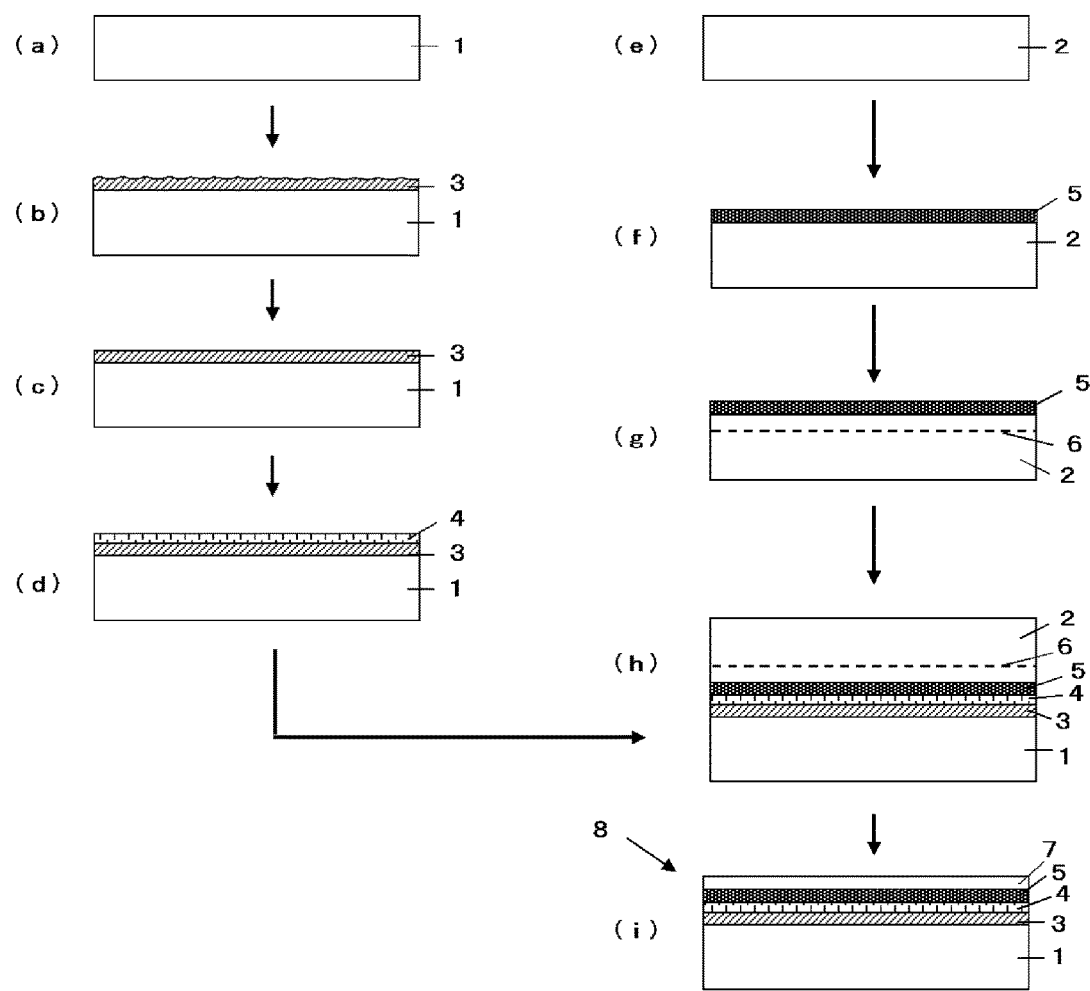
FIG. 1 shows schematic drawings for illustrating an example of a method for manufacturing a bonded SOI wafer of the present invention.

FIG. 1 shows schematic drawings for illustrating an example of a method for manufacturing a bonded SOI wafer of the present invention.

In the method for manufacturing a bonded SOI wafer in FIG. 1, first, a base wafer 1 and a bond wafer 2 each composed of a silicon single crystal are prepared (FIGS. 1(a) and (e)). In this event, a silicon single crystal wafer having a resistivity of 100 Ω·cm or more is prepared as the base wafer 1.

The base wafer 1 having a resistivity of 100 Ω·cm or more can be suitably used for manufacturing radio-frequency devices. The resistivity is more preferably 1000 Ω·cm or more, particularly preferably 3000 Ω·cm or more. The upper limit of the resistivity is not particularly limited, and can be, for example, 50000 Ω·cm.

Next, a polycrystalline silicon layer 3 is deposited on a bonding surface side of the base wafer 1 (FIG. 1(b)). This polycrystalline silicon layer can be deposited by using, for example, an epitaxy growth apparatus.

Then, a surface of the polycrystalline silicon layer 3 deposited on the surface of the base wafer 1 is polished to obtain a polished surface (FIG. 1(c)). Note that the polished surface preferably has a surface roughness (RMS, 1 μm square) of 0.3 nm or less. Additionally, the lower limit of the RMS of the polished surface is not particularly limited, and can be, for example, 0 nm or more.

Next, a thermal oxide film 4 is formed on the polished surface of the polycrystalline silicon layer 3 by, for example, thermal oxidation or the like (FIG. 1(d)). The thermal oxide film 4 should have a thickness of 15 nm or more, preferably in a range from 15 nm or more to 25 nm or less. If the thermal oxide film 4 has a thickness of less than 15 nm, the diffusion of boron sandwiched at a bonding interface at the time of bonding at room temperature cannot be sufficiently suppressed, so that a decrease in the resistivity of the high-resistivity substrate cannot be suppressed.

Moreover, the thermal oxide film 4 has a surface with a surface roughness (RMS, 1 μm square) of 0.6 nm or less. If the RMS of the surface of the thermal oxide film 4 exceeds 0.6 nm, generation of voids and blisters at the time of bonding cannot be suppressed. Meanwhile, the lower limit of the RMS of the surface of the thermal oxide film 4 is not particularly limited, and can be, for example, 0 nm or more.

Notably, the present inventors have found for the first time that the smaller the thickness of a thermal oxide film formed by thermal oxidation of a polycrystalline silicon layer, the more favorable the surface roughness of the surface of the thermal oxide film; with the favorable surface roughness, bonding failure is unlikely to occur. Based on this, in the present invention, the polished surface of the polycrystalline silicon layer is set to have an RMS of 0.3 nm or less, and the thickness of the thermal oxide film is set at a predetermined thickness (for example, 25 nm or less), so that the RMS of the surface of the thermal oxide film can be surely suppressed to 0.6 nm or less.

Next, an insulator film 5 (for example, oxide film) serving as a buried oxide film layer is formed on a bonding surface of the bond wafer 2 by, for example, thermal oxidation, CVD, or the like (FIG. 1(f)). In this case, the insulator film 5 may be formed not only on the bonding surface but also on the entire surface of the bond wafer.

In the subsequent steps, the base wafer having the polycrystalline silicon layer and the thermal oxide film formed thereon as described above is bonded to the bond wafer having the insulator film formed thereon; then, the bond wafer is thinned to form an SOI layer. In the inventive method for manufacturing a bonded SOI wafer, the step of thinning the bond wafer to form an SOI layer is preferably performed according to an ion implantation delamination method.

When the SOI layer is formed according to the ion implantation delamination method, for example, after the insulator film 5 is formed (FIG. 1(f)) as described above, at least one type of gas ions selected from a hydrogen ion and a rare gas ion are implanted into the bond wafer 2 through the insulator film 5 with an ion implanting apparatus to thereby form an ion implanted layer 6 in the bond wafer 2 (FIG. 1(g)).

Next, the base wafer 1 having the polycrystalline silicon layer 3 and the thermal oxide film 4 formed thereon is brought into close contact with and bonded to the bond wafer 2 having the insulator film 5 and the ion implanted layer 6 formed thereon and therein such that the surface where the thermal oxide film 4 has been formed contacts thereto (FIG. 1(h)).

Then, the bonded bond wafer 2 is thinned to form an SOI layer 7.

When the SOI layer is formed by the ion implantation delamination method, the bonded wafer is subjected to a heat treatment (delamination heat treatment) by which a micro bubble layer is formed in the ion implanted layer 6. The bond wafer 2 is delaminated along the ion implanted layer 6 (micro bubble layer). Thus, a bonded SOI wafer 8 is manufactured in which the insulator film 5 and the SOI layer 7 are formed on the base wafer 1 (FIG. 1(i)).

The bonded SOI wafer manufactured as described above is subjected to heat treatments such as a bonding heat treatment for increasing the bonding strength at the bonding interface, a flattening heat treatment for flattening the surface of the SOI layer after the thinning, and a sacrificial oxidation heat treatment for adjusting the thickness of the SOI layer.

Note that, in the present invention, these heat treatments after the bonding step are performed with a maximum treatment temperature of 1150° C. or less. Incidentally, the bonding heat treatment is performed on the bonded SOI wafer in every case. This bonding heat treatment may be performed simultaneously with or separately from the flattening heat treatment, the sacrificial oxidation heat treatment, and so forth. In other words, regardless of the name or purpose of the heat treatment in the present invention, all of these heat treatments performed after the bonding step need to have the maximum treatment temperature set at 1150° C. or less.

If the maximum treatment temperature in the heat treatments performed after the bonding step exceeds 1150° C., even when the thermal oxide film formed on the polished surface of the polycrystalline silicon layer has a thickness of 15 nm or more, the diffusion of boron sandwiched at the bonding interface at the time of bonding at room temperature cannot be sufficiently suppressed, and a decrease in the resistivity of the high-resistivity substrate cannot be suppressed. Meanwhile, the lower limit of the maximum treatment temperature in the heat treatments performed after the bonding step is not particularly limited, but is preferably 800° C. or more.

The inventive method for manufacturing a bonded SOI wafer as explained above suppresses an influence of boron contamination from the bonding interface, making it possible to suppress a decrease in the resistivity of the high-resistivity substrate.

Hereinafter, by showing Experimental Examples, more specific description will be given of a relation between the thickness and the surface roughness of the thermal oxide film formed on the polished surface of the polycrystalline silicon layer, as well as a relation between the maximum treatment temperature in a heat treatment performed after the bonding step and the resistivity of the base wafer.

Experimental Example 1

As the base wafer, multiple mirror-polished silicon single crystal wafers were prepared each of which had a diameter of 300 mm, a crystal orientation of <100>, and a resistivity of 3000 Ω·cm. On the surface of each wafer, a polycrystalline silicon layer was deposited with a thickness of 3 µm by using an atmospheric pressure epitaxy growth apparatus. The surface of the polycrystalline silicon layer was polished by 1 µm to prepare a wafer in which the polished surface of the polycrystalline silicon layer had a surface roughness (RMS in 1 µm square under an AFM (atomic force microscope)) of 0.20 nm.

Figure 2:
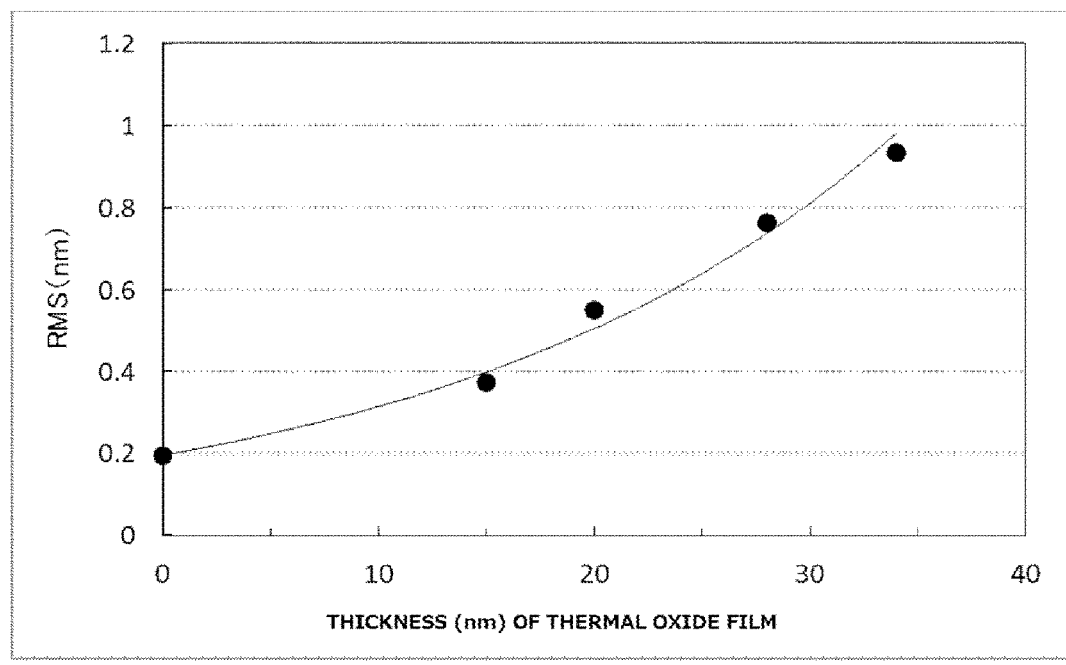
FIG. 2 is a graph for illustrating a relation between the thickness and the surface roughness (RMS) of a thermal oxide film in Experimental Example 1.

These wafers were subjected to thermal oxidation for various thermal oxidation times to form thermal oxide films having thicknesses of 15 nm, 20 nm, 28 nm, and 34 nm, respectively. The surface roughness (RMS in 1 µm square under the AFM) of the surface of each thermal oxide film was measured. Table 1 and FIG. 2 show the result. Note that FIG. 2 was obtained by plotting the result in Table 1 on a graph.

TABLE 1

| Film thickness (nm) | RMS (nm) |
|---|---|
| 0 | 0.20 |
| 15 | 0.37 |
| 20 | 0.55 |
| 28 | 0.76 |
| 34 | 0.93 |

As shown in Table 1 and FIG. 2, in the wafers having the thermal oxide films formed with the thicknesses of 15 nm and 20 nm, the thermal oxide films had the surfaces with an RMS of 0.6 nm or less. In contrast, in the wafers having the thermal oxide films formed with the thicknesses of 28 nm and 34 nm, the thermal oxide films had the surfaces with an RMS exceeding 0.6 rm.

The wafers having these thermal oxide films formed thereon were each bonded to a bond wafer (a silicon single crystal wafer with an oxide film and an ion implanted layer for delamination having been formed therein). The bond wafer was delaminated by the delamination heat treatment to form an SOI layer. Thus, a bonded SOI wafer was manufactured. The presence or absence of bonding failure (void generation) in such bonded SOI wafers was checked. As a result, void generation was observed only when the wafers having the thermal oxide films whose surfaces had an RMS exceeding 0.6 nm (the thicknesses of the thermal oxide films: 28 nm, 34 nm) were used.

Experimental Example 2

Figure 3:
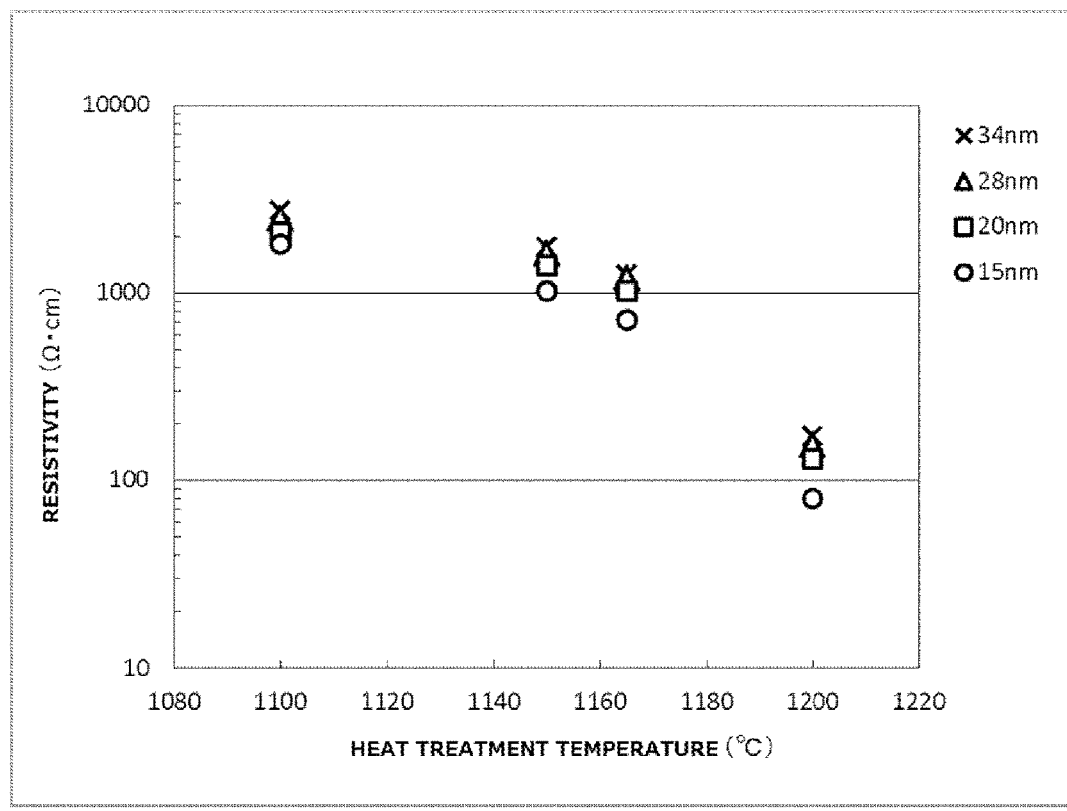
FIG. 3 is a graph for illustrating a relation between the maximum treatment temperature in a heat treatment (flattening heat treatment) performed after a bonding step and the resistivity of a base wafer in Experimental Example 2.

The surfaces of the SOI layers of the bonded SOI wafers manufactured in Experimental. Example 1 were subjected to sacrificial oxidation at 900° C. and oxide film removal. Then, as the flattening heat treatment, a heat treatment (100% Ar atmosphere) was performed in a range from 1100 to 1200° C. for 2 hours. The resistivity distribution from the bonding interface to the vicinity of the base wafer surface in a depth direction was measured by SR (Spreading Resistance) measurement, and the minimum resistivity values were obtained. Table 2 and FIG. 3 show the result. Note that FIG. 3 was obtained by plotting the result in Table 2 on a graph.

TABLE 2

|  | Resistivity (Ω · cm) | | | |
| --- | --- | --- | --- | --- |
|  | Film thickness 15 nm | Film thickness 20 nm | Film thickness 28 nm | Film thickness 34 nm |
| Heat treatment temperature (° C.) | 1100 1820 | 2102 | 2487 | 2740 |
|  | 1150 1030 | 1400 | 1610 | 1750 |
|  | 1165 720 | 1018 | 1205 | 1247 |
|  | 1200 80 | 131 | 155 | 170 |

As shown in Table 2 and FIG. 3, when the heat treatment temperature was 1100° C. to 1150° C., all the base wafers kept the high resistivity of 1000 Ω·cm or more. In contrast, when the heat treatment temperature exceeded 1150° C., the resistivity decreased significantly; the base wafer having the thermal oxide film with the thickness of 15 nm had a resistivity less than 1000 Ω·cm. Particularly, it was found that at 1200° C., the resistivity of the base wafers extremely decreased.

EXAMPLES

Hereinafter, the present invention will be more specifically described with reference to Examples and Comparative Examples, but the present invention is not limited thereto.

Example 1

As the base wafer, a mirror-polished silicon single crystal wafer was prepared with a diameter of 300 mm, p type, a crystal orientation of <100>, and a resistivity of 3000 Ω·cm. On the surface of the base wafer, a polycrystalline silicon layer was deposited with a thickness of 3 μm by using an atmospheric pressure epitaxy growth apparatus. The surface of the polycrystalline silicon layer was polished by 1 μm, so that the polished surface of the polycrystalline silicon layer had a surface roughness (RMS in 1 μm square under the AFM) of 0.20 nm.

The base wafer was subjected to thermal oxidation to form a thermal oxide film having a thickness of 15 nm on the polished surface of the polycrystalline silicon layer. The surface roughness (RMS in 1 μm square under the AFM) of the surface of this thermal oxide film was measured and found to be 0.35 nm.

Meanwhile, as the bond wafer, a silicon single crystal wafer (diameter: 300 mm, p type, crystal orientation: <100>, resistivity: 10 Ω·cm) was prepared. On the surface, an oxide film (insulator film) having a thickness of 180 nm was formed.

Then, for the thinning by the ion implantation delamination method, hydrogen ions were implanted through the oxide film thus formed. Note that the conditions for implanting the hydrogen ions were: an acceleration energy of 50 keV and a dose of $5 \times 10^{16}/cm^2$.

The base wafer having the polycrystalline silicon layer and the thermal oxide film formed thereon as described above was bonded to the bond wafer having the insulator film and the ion implanted layer formed thereon and therein as described above. The bond wafer was delaminated by the delamination heat treatment at 500° C. for 30 minutes to form an SOI layer. Thus, a bonded SOI wafer was manufactured. The presence or absence of bonding failure (void generation) in the manufactured bonded SOI wafer was evaluated. Table 3 shows the result.

Moreover, after the delamination, the SOI layer surface (delaminated surface) was subjected to a sacrificial oxidation treatment (900° C. oxidation (oxide film thickness: 200 nm)+oxide film removal), a flattening heat treatment (1150° C., 2 hours, 100% Ar atmosphere), and a sacrificial oxidation treatment (900° C. oxidation+oxide film removal). Thereby, the SOI layer had a thickness of 80 nm.

The resistivity (Ω·cm) of the base wafer in the bonded SOI wafer subjected to the above heat treatments was measured. Table 3 shows the result.

Example 2

A bonded SOI wafer was manufactured and subjected to the heat treatments as in Example 1. Nevertheless, the thermal oxide film formed on the polished surface of the polycrystalline silicon layer was set to have a thickness of 20 nm. The thermal oxide film had a surface with an RMS of 0.45 nm.

Moreover, as in Example 1, the presence or absence of void generation was evaluated, and the resistivity of the base wafer was measured. Table 3 shows these results.

Example 3

A bonded SOI wafer was manufactured and subjected to the heat treatments as in Example 1. Nevertheless, the thermal oxide film formed on the polished surface of the polycrystalline silicon layer was set to have a thickness of 25 nm. The thermal oxide film had a surface with an RMS of 0.55 nm.

Moreover, as in Example 1, the presence or absence of void generation was evaluated, and the resistivity of the base wafer was measured. Table 3 shows these results.

Comparative Example 1

A bonded SOI wafer was manufactured and subjected to the heat treatments as in Example 1. Nevertheless, the thermal oxide film formed on the polished surface of the polycrystalline silicon layer was set to have a thickness of 30 nm. The thermal oxide film had a surface with an RMS of 0.8 nm.

Moreover, as in Example 1, the presence or absence of void generation was evaluated, and the resistivity of the base wafer was measured. Table 3 shows these results.

Comparative Example 2

A bonded SOI wafer was manufactured and subjected to the heat treatments as in Example 1. Nevertheless, the thermal oxide film formed on the polished surface of the polycrystalline silicon layer was set to have a thickness of 10 nm. The thermal oxide film had a surface with an RMS of 0.3 nm.

Moreover, as in Example 1, the presence or absence of void generation was evaluated, and the resistivity of the base wafer was measured. Table 3 shows these results.

Comparative Example 3

A bonded SOI wafer was manufactured and subjected to the heat treatments as in Example 1. Nevertheless, no thermal oxide film was formed on the polished surface of the polycrystalline silicon layer.

Moreover, as in Example 1, the presence or absence of void generation was evaluated, and the resistivity of the base wafer was measured. Table 3 shows these results.

Comparative Example 4

A bonded SOI wafer was manufactured and subjected to the heat treatments as in Example 1. Nevertheless, the flattening heat treatment was performed under conditions of: 1200° C., 1 hour, and 100% Ar atmosphere.

Moreover, as in Example 1, the presence or absence of void generation was evaluated, and the resistivity of the base wafer was measured. Table 3 shows these results.

Comparative Example 5

A bonded SOI wafer was manufactured and subjected to the heat treatments as in Example 1. Nevertheless, the thermal oxide film formed on the polished surface of the polycrystalline silicon layer was set to have a thickness of 25 nm. In addition, the flattening heat treatment was performed under conditions of: 1200° C., 1 hour, and 100% Ar atmosphere. The thermal oxide film formed on the polished surface of the polycrystalline silicon layer had a surface with an RMS of 0.55 nm.

Moreover, as in Example 1, the presence or absence of void generation was evaluated, and the resistivity of the base wafer was measured. Table 3 shows these results.

TABLE 3

| | | Ex. 1 | Ex. 2 | Ex. 3 | Com. Ex. 1 | Comp. Ex. 2 | Com. Ex. 3 | Com. Ex. 4 | Com. Ex. 5 |
|---|---|---|---|---|---|---|---|---|---|
| Conditions | Thickness (μm) of deposited polycrystalline silicon layer | 3 | 3 | 3 | 3 | 3 | 3 | 3 | 3 |
| | Polishing stock removal (μm) of polycrystalline silicon layer | 1 | 1 | 1 | 1 | 1 | 1 | 1 | 1 |
| | RMS (nm) of polished surface of polycrystalline silicon layer | 0.20 | 0.20 | 0.20 | 0.20 | 0.20 | 0.20 | 0.20 | 0.20 |
| | Thickness (nm) of thermal oxide film | 15 | 20 | 25 | 30 | 10 | 0 | 15 | 25 |
| | RMS (nm) of surface of thermal oxide film | 0.35 | 0.45 | 0.55 | 0.80 | 0.30 | — | 0.35 | 0.55 |
| | Maximum heat treatment temperature (° C.) | 1150 | 1150 | 1150 | 1150 | 1150 | 1150 | 1200 | 1200 |
| Evaluation | Void generation | none | none | none | generated | none | none | none | none |
| | Resistivity (Ω·cm) of base wafer (when bonded SOI wafer was completed) | 1020 | 1380 | 1550 | 1650 | 800 | 100 | 80 | 140 |

As shown in Table 3, in Examples 1 to 3 where the bonded SOI wafers were manufactured according to the inventive method for manufacturing a bonded SOI wafer, no void was generated, and the resistivity of 1000 Ω·cm was ensured for the base wafers.

On the other hand, in Comparative Example 1 where the thermal oxide film had the surface with an RMS exceeding 0.6 nm, voids were generated. Moreover, large decreases in the resistivity of the base wafers were observed in Comparative Example 2 where the thermal oxide film had the thickness of less than 15 nm, Comparative Example 3 where no thermal oxide film was formed, and Comparative Examples 4, 5 where the heat treatment (flattening heat treatment) was performed with the maximum treatment temperature exceeding 1150° C. after the bonding step.

It should be noted that the present invention is not restricted to the above-described embodiments.

The embodiments are merely examples, and any embodiments that have substantially the same feature and demonstrate the same functions and effects as those in the technical concept as disclosed in claims of the present invention are included in the technical scope of the present invention.

The invention claimed is:

1. A method for manufacturing a bonded SOI wafer by bonding a bond wafer and a base wafer each composed of a silicon single crystal with an insulator film being interposed therebetween, the method comprising the steps of:

depositing a polycrystalline silicon layer on a bonding surface side of the base wafer;

polishing a surface of the polycrystalline silicon layer to obtain a polished surface;

forming a thermal oxide film on the polished surface;

forming the insulator film on a bonding surface of the bond wafer;

a bonding step of bonding the bond wafer and the base wafer by bringing the insulator film and the thermal oxide film into close contact with each other; and thinning the bonded bond wafer to form an SOI layer, wherein a silicon single crystal wafer having a resistivity of 100 Ω·cm or more is used as the base wafer, the thermal oxide film formed on the polished surface has a thickness of 15 nm or more, the thermal oxide film formed on the polished surface has a surface with an RMS of 0.6 nm or less, and any heat treatment after the bonding step is performed with a maximum treatment temperature of 1150° C. or less.

2. The method for manufacturing a bonded SOI wafer according to claim 1, wherein the polished surface has an RMS of 0.3 nm or less, and the thermal oxide film formed on the polished surface has a thickness of 25 nm or less.

* * * * *